United States Patent [19]

Goldsamt

[11] 3,973,113

[45] Aug. 3, 1976

[54] ELECTRONIC CALCULATOR FOR FEET-INCH-FRACTION NUMERICS

[76] Inventor: Alan B. Goldsamt, Banksville Road, Greenwich, Conn. 06830

[22] Filed: Sept. 19, 1974

[21] Appl. No.: 507,621

[52] U.S. Cl................................. 235/156; 235/154
[51] Int. Cl.²......................................... G06F 3/02
[58] Field of Search........... 235/156, 168, 169, 170, 235/154; 340/365 R, 172.5

[56] References Cited
UNITED STATES PATENTS

| | | | |
|---|---|---|---|
| 3,654,449 | 4/1972 | Boyce | 235/156 |
| 3,739,161 | 6/1973 | Gross et al. | 235/156 |
| 3,809,872 | 5/1974 | Yamamura et al. | 235/170 |
| 3,816,731 | 6/1974 | Jennings et al. | 235/156 |

Primary Examiner—David H. Malzahn
Attorney, Agent, or Firm—Sherman & Shalloway

[57] ABSTRACT

An apparatus is disclosed for automatically adding, subtracting, multiplying and dividing feet, inches and fractions of an inch and for the recordation of the results of said arithmetic functions on a visual display. The apparatus also automatically and directly converts feet, inches and fractions of an inch into decimal equivalents and into the metric system of measurement and, similarly, converts numbers in decimal numeric and in metric measurement automatically and directly into feet, inches and fractions of an inch.

8 Claims, 6 Drawing Figures

ELECTRONIC CALCULATOR FOR FEET-INCH-FRACTION NUMERICS

BACKGROUND OF THE INVENTION

1. Field of the Invention

The present invention relates to an apparatus which will be capable of performing the arithmetic functions of addition, subtraction, multiplication and division and the functions of conversion where the data entered into the apparatus is in measurement of feet, inches and fractions of an inch and also in decimal and metric measurement equivalents of feet, inches and fractions of an inch.

2. Technical Considerations and Prior Art

Currently available electronic calculators basically utilize a keyboard with ten character keys identified by and identifying the digits zero to nine, and the four function keys identified by signs representing the arithmetic functions of addition (+), subtraction (−), multiplication (×) and division (÷), plus a key identified as an equal (=) key for finalizing the arithmetic functions of multiplication and division and, in some models, for addition and subtraction. There are generally other auxiliary keys or switches such as the "clear" key, "clear entry" key, and "decimal selector" switch, to set the decimal at a predetermined place (2 places, 3 places, etc.), or to permit the decimal to "float". Some calculators have "percent" keys, "square" keys, "square root" keys, "reciprocal" keys, "memory" keys, trigonometric conversion keys, metric measurement conversion keys, and other auxiliary keys.

The construction and operation of currently available electronic calculators is well known to those familiar with and skilled in the art of electronic calculators.

However, with currently available electronic calculators, calculations in feet, inches and fractions of an inch (hereinafter referred to as "fractions") cannot be directly performed except where "feet" is exact, or in metric equivalent obtained from printed conversion tables, and except where the feet-inch-fraction numeric is converted into decimal equivalent or metric equivalent, also by the use of equivalency tables. For example, two measurements of 2 feet 6 inches and 6 feet 3 inches cannot be directly added together, but must first be converted into decimal equivalents of 2.5 feet and 6.25 feet, respectively, and then entered into the calculator and added, thus: 2.5 plus (+) 6.25 equals (=) 8.75. The user would then have to mentally convert 8.75 feet to 8 feet 9 inches.

SUMMARY OF THE INVENTION

An object of the present invention is to provide a new apparatus which will be capable of performing the arithmetic functions of addition, subtraction, multiplication and division and the functions of conversion where the data entered into the apparatus is in measurement of feet, inches and fractions, and also in decimal and metric measurement equivalents of feet, inches and fractions.

It is a further object of the present invention to be able to directly convert feet-inch-fraction numerics to decimal and metric equivalents.

It is another object of the instant invention to directly convert decimal and metric measurement numerics to feet-inch-fraction equivalents.

To achieve the afore-mentioned objects of the present invention, the apparatus has three separate and distinct keyboards, together with a visual display and a plurality of auxiliary keys, switches and visible indicators. The apparatus also includes means for selectively and automatically entering feet, inch and fraction numerics into the apparatus and, by depressing the function keys, to selectively and automatically add, subtract, multiply and divide the numbers entered into the apparatus and, by depressing specific auxiliary conversion keys, to directly convert feet-inch-fraction numerics into, and from, decimal and metric measurement equivalents.

DETAILED DESCRIPTION

The Console

Figure 1:
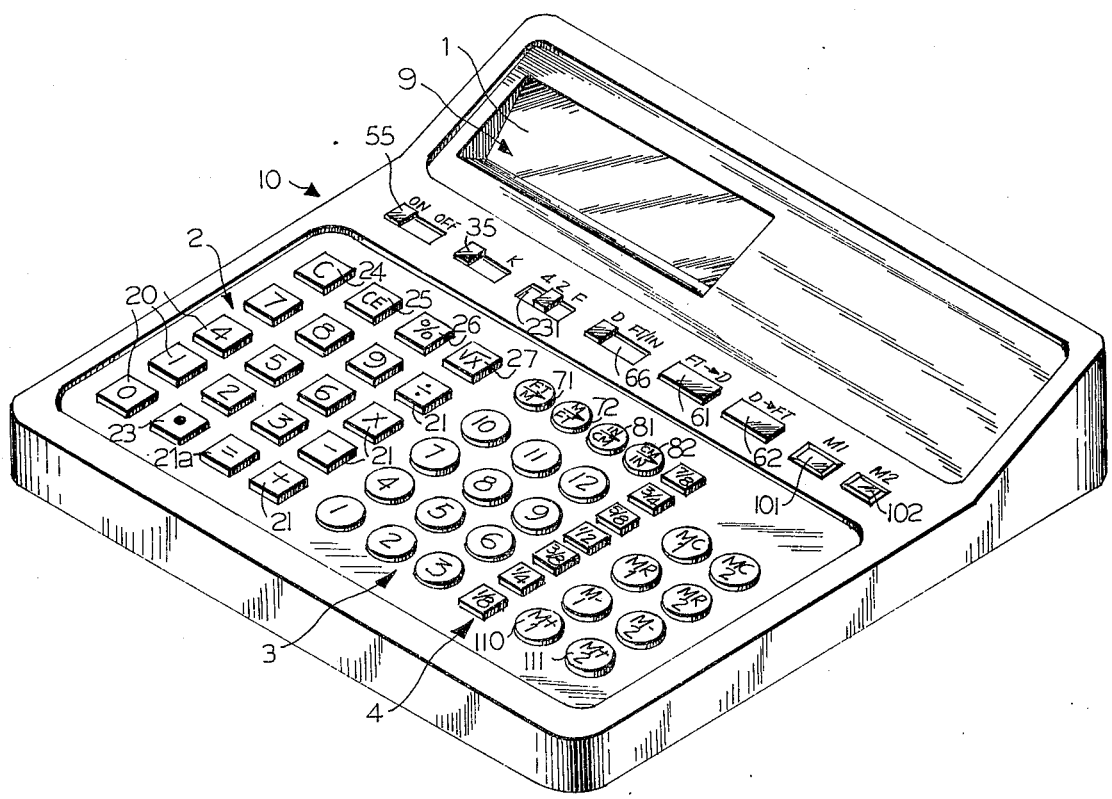
FIG. 1 is an isometric drawing of the apparatus.
Figure 2:
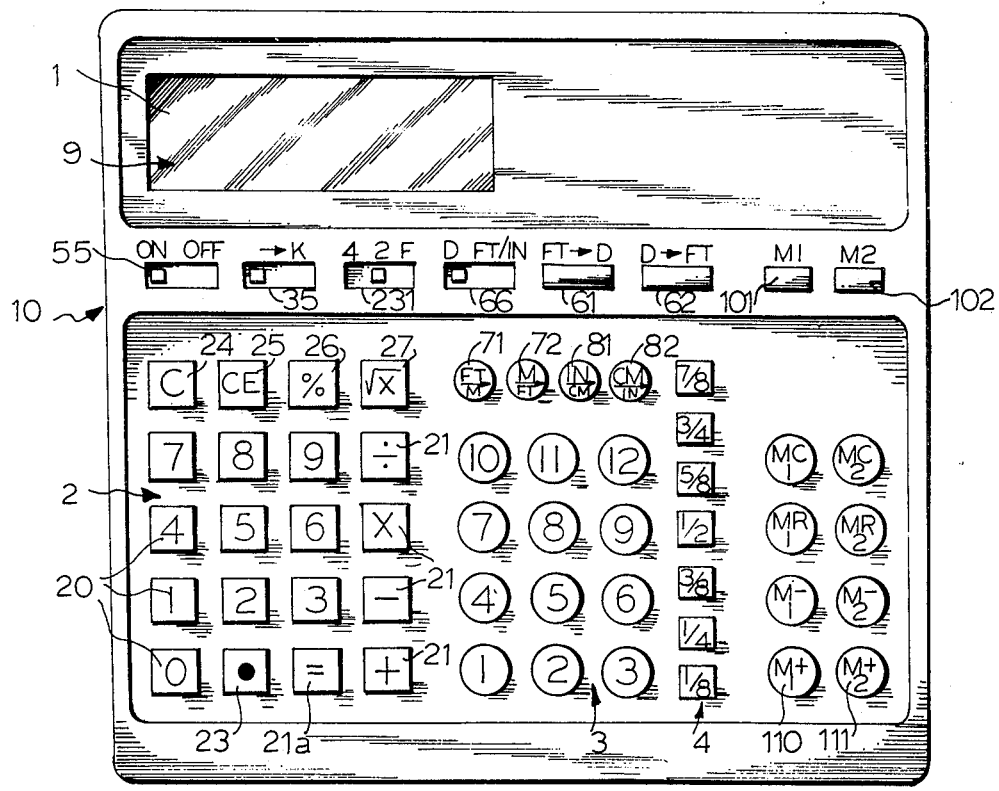
FIG. 2 is a top plan view of the apparatus indicating the keyboards, display, auxiliary keys, switches and visible indicators.

Referring now to FIGS. 1 and 2, there is shown a console, generally designated by the numeral 10, which includes a display 1 having three separate and distinct displays; one for feet, one for inches and one for fractions. These three displays will be referred to hereinafter as the "Primary" Display, for representation of feet and for representation of usual calculations not involving inches and fractions, except for conversions to and from decimal numeric and to and from metric measurement; the "Inch" Display for representation of inches; and the "Fraction" Display for representation of fractions. The Primary Display also includes a "negative sign" indicator (not shown) and an "Error" indicator (not shown) and a "remainder" indicator 9 to be illuminated during various functions.

The console 10 also includes a keyboard generally designated by the numeral 2, hereinafter referred to as the Primary Keyboard. This keyboard 2 is associated with a "Primary Core" 22 and is similar to those found on most currently available electronic calculators, with a plurality of keys 20 representing the digits zero through nine; four function keys 21 to perform automatically upon command the arithmetic functions of addition, subtraction, multiplication and division; an equals key 21a to perform automatically upon command the final result of the multiplication and division; a decimal key 23 to enter the decimal point into the apparatus; a clear key 24 to automatically upon command clear all numerics entered into the apparatus; a clear entry key 25 to automatically upon command clear the last numeric entered into the apparatus; a percent key 26 to automatically upon command determine the percent of a numeric previously entered into the apparatus; and a square root key 27 to automatically upon command determine the square root of a numeric previously entered into the apparatus.

The potential of providing other capabilities in the apparatus, such as squaring a number entered into the apparatus, may also be included. The inclusion of percent and square root capabilities has been made for convenience in this disclosure and has been made on the basis that these two auxiliary functions would be significant value to those users of the apparatus who are most frequently involved in measurements of feet, inches and fractions.

In addition, the console 10 includes an inch keyboard 3 associated with an "Inch Core" 33 and having a plurality of keys representing the digits one through twelve, and a Fractions of an inch keyboard 4 associated with a "Fraction Core" 44 and having a plurality of keys representing the following fractions: ⅛, ¼, ⅜, ½, ⅝, ¾ and ⅞. It should be noted here that indications of keys representing fractions from ⅛ inch through ⅞ inch, in ⅛ inch increments, are not intended to limit the capabilities of the apparatus in performing the required functions only in ⅛ inch increments, and is indicated for convenience in this disclosure. Measurement in ⅛ inch increments is most commonly used, but the apparatus will have the capability of performing the required functions should be fraction measurement be in 1/16 inch increments (1/16 inch through 15/16 inch), in 1/32 inch increments (1/32 inch through 31/32 inch), or in any other subdivisions of one inch, with a Fraction Keyboard provided for the desired increments.

The console 10 further includes a series of operational switches such as a switch 55 to turn the apparatus "on" and "off", and an Operation Selector Switch 66 to assign operation of the apparatus to the appropriate keyboards. To operate the apparatus using the Inch 3 and Fraction 4 keyboards, the switch 66 must be placed in the FT/IN position. In that position, the Primary Keyboard 2 will operate. However, when the switch is placed in the D position, only the Primary Keyboard 2 will operate. This is a safeguard measure to prevent the user from mistakenly using the Inch Keyboard 3 as though it were the Primary Keyboard 2.

A switch 35 is provided to enable a numeric entered into the apparatus to function as a constant for use with the four major functions of addition, subtraction, multiplication and division. This capability, however, exists in virtually all electronic calculators currently available.

The console 10 also includes a Decimal Selector Switch 231 to assign to the apparatus that the resultant answer to commands of the function keys be in two or four place decimal numeric or to permit the decimal to "float" to its final position based on the decimal numbers entered into the apparatus and the function determined by the required arithmetic function. It should be noted here that indication of decimal positioning to two or four places is only for convenience of this disclosure. Decimal positioning can be for one to seven positions for an apparatus with an eight digit Primary Display or, more generally, from one to N-1 positions for an N digit Primary Display. It should also be noted here that the Primary Display 1, the Primary Keyboard 2, the on/off switch 55, the constant switch 35 and the Decimal Selector Switch 231 are common to most currently available electronic calculators and, as such, permit the apparatus disclosed herein to operate and function as most currently available electronic calculators when not making use of the capabilities of the Inch and Fraction Displays, keyboards and auxiliary keys, switches and visual indicators.

In addition, the console 10 includes an array of conversion keys. The array includes conversion key 61 to permit a feet, inch and fraction numeric entered into the apparatus, recorded in the Primary, Inch and Fraction Displays, to be automatically and directly converted upon command to decimal equivalent with the decimal positioned to two or four places as assigned by the Decimal Selector Switch 231 and recorded in the Primary Display 1.

A conversion key 62 permits a number entered into the apparatus, recorded in the Primary Display 1, with or without decimal point, to be automatically and directly converted upon command into feet, inches and fractions recorded in the Primary, Inch and Fraction Displays 1.

A conversion key 71 permits a feet, inch and fraction numeric entered into the apparatus to be automatically and directly converted upon command to meters in metric measurements with the decimal point positioned to two or four places as assigned by the Decimal Selector Switch 231 and recorded in the Primary Display 1.

A conversion key 72 permits a number entered into the apparatus and recorded in the Primary Display 1, with or without decimal point, to be automatically and directed converted upon command into feet, inches and fractions, and recorded in the Primary, Inch and Fraction Displays 1.

A conversion key 81 permits an inch and/or fraction numeric entered into the apparatus to be automatically and directly converted upon command into centimeters in metric measurement with the decimal point positioned to two or four places are assigned by the Decimal Selector Switch 231 and recorded in the Primary Display 1.

A conversion key 82 permits a number entered into the apparatus and recorded in the Primary Display 1, with or without decimal point, to be automatically and directly converted upon command into inches and/or fractions, and recorded in the Inch and Fraction Displays 1.

It should be noted here that the indication of conversions to and from centimeters is not intended to limit conversion only to and from centimeters. The apparatus will be capable of conversion to and from millimeters or any other mode of linear measurement. The indication of centimeters is only for the convenience of this disclosure.

In order to coordinate operation of the various keys and switches on the console 10 with one another, a keyboard 110, referred to hereinafter as Memory Keyboard One, is utilized with a plurality of keys designated as M + 1 (Memory Plus One), M − 1 (Memory Minus One), M R 1 (Memory recall One) and M C 1 (Memory Clear One). In addition, a keyboard 111, referred to hereinafter as Memory Keyboard Two, is included with a plurality of keys designated as M + 2, M − 2, M R 2, M C 2, similarly to keyboard 110.

In order to indicate when numerics have been entered into Memory One, an indicator lamp 101 is lighted and, in order to indicate when numerics have been entered into Memory Two, an indicator lamp 102 is lighted.

Addition

Figure 3:
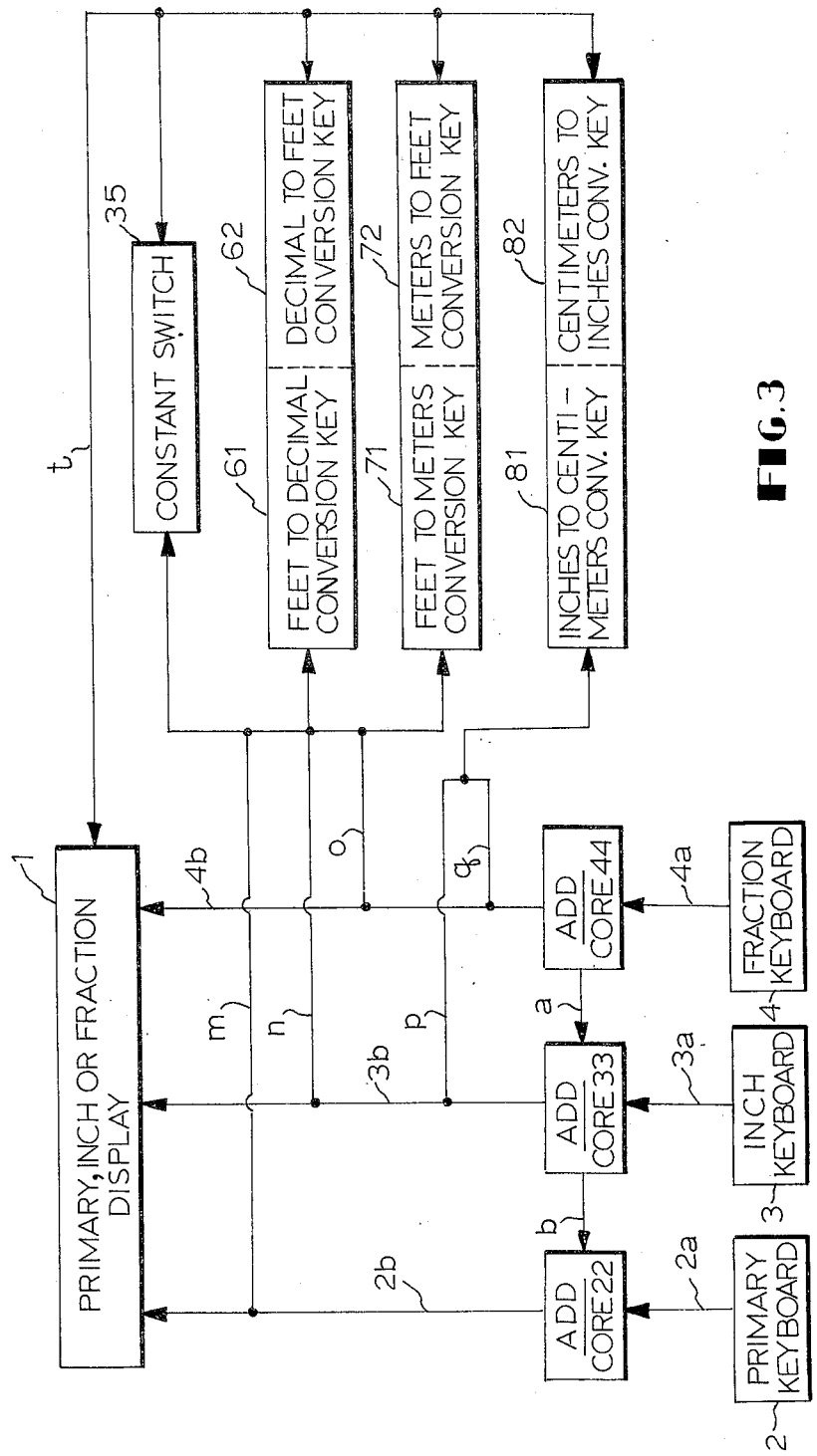
FIG. 3 is a block diagram illustrating the apparatus for performing addition.

FIG. 3 is a block diagram illustrating the method by which addition of feet, inches and fractions will be performed in the apparatus. Beginning with the Fraction Keyboard 4, there are seven character keys representing the fractions ⅛, ¼, ⅜, ½, ⅝, ¾ and ⅞, with the characters ⅛ thru ⅞ etched on the upper surface of the keys. When an initial fraction character key is depressed, a momentary contact is made within the apparatus and the selected fraction is entered into the apparatus via impulse 4a and is retained there in Fraction Core 44 until the addition key 21 is depressed. When the addition Key 21 is depressed, making momentary contact within the apparatus, the selected fraction retained in Fraction Core 44 is, by appropriate means via impulse 4b, recorded in the Fraction Display 1 while still being retained within Fraction Core 44. When a second fraction character key is depressed, a momentary contact is made within the apparatus and the second selected fraction is entered into the apparatus via impulse 4a and is retained there in Fraction Core 44 until the addition Key 21 is depressed. When the addition Key 21 is depressed, making momentary contact within the apparatus, the second fraction is automatically added to the first fraction and the sum of the two fractions is, by appropriate means via impulse 4b, recorded in the Fraction Display 1 while the sum of the two fractions is retained within Fraction Core 44.

Note that each character key, in each keyboard, is normally in a rest position and, after being depressed, automatically returns to the rest position by means of a spring or other appropriate means.

When third and subsequent fraction character keys are depressed, the same sequence will be followed as described when the second fraction character keys and addition keys 21 are depressed.

At some point in the addition of fractions, whether by depressing the second or subsequent fraction character keys and the addition key 21, the sum of the fractions will be equal to or will exceed unity. When this happens, momentary contact within the apparatus will cause the second or subsequent fraction to be entered into the apparatus via impulse 4a and will be retained there in Fraction Core 44. When the addition key 21 is depressed, a unit impulse will be transferred via impulse $a$ to the Inch Core 33 of the apparatus. At that time, the unit (one) will be automatically added to whatever inches are retained within the Inch Core 33 of the apparatus, while the remainder, if any, is retained in the Fraction Core 44 of the apparatus.

Almost simultaneously, depending on the operating speed of the apparatus, the sum of the two fractions will be recorded in the Inch Display via impulse 3b and in the Fraction Display via impulse 4b, while the sums are retained, individually and respectively, in the Inch Core 33 and Fraction Core 44. Continued addition of fractions will, as described herein, automatically transfer one unit via impulse $a$ to the Inch Core 33 when the sum of fractions equals or exceeds unity.

During the addition of fractions, there will be a time when the sum of two fractions is exactly unity, in which case the unit, one, will be automatically added to whatever inches are retained within the Inch Core 33 of the apparatus. However, since there is no remainder, the Fraction Core 44 will retain the number 0 and the Inch Display 1 will record the accumulated sum of Inches (1 to 11), and the Fraction Display 1 will not be activated.

It should be noted here that the equals (=) function key 21a has yet to be used to finalize the sums of two or more fractions. The sums of two or more fractions will be cumulatively recorded in the Fraction Display 1 or in both the Inch Display 1 and the Fraction Display 1. In general, all sums of Feet, Inches and Fractions will be cumulative.

There are twelve character keys representing the inches 1 thru 12 with the characters 1–12 etched on the upper surface of the keys in the Inch Keyboard 3. When an initial inch character key is depressed, a momentary contact is made within the apparatus and the selected inch is entered into the apparatus via impulse 3a and is retained in the Inch Core 33 until the addition key 21 is depressed. When the addition key 21 is depressed, making momentary contact within the apparatus, the selected inch retained within Core 33 is, by appropriate means via impulse 3b, recorded in the Inch Display 1 while still being retained within the Inch Core 33. When a second inch character key is depressed, a momentary contact is made within the apparatus and the second selected inch is entered into the apparatus via impulse 3a and is retained in Inch Core 33 until the addition key 21 is depressed. When the addition key 21 is depressed, making momentary contact within the apparatus, the second inch is automatically added to the first inch and the sum of the two inches is, by appropriate means via impulse 3b, recorded in the Inch Display while the sum of the 2 inches is retained in the Inch Core 33. When third and subsequent inch character keys are depressed, the same sequence will be followed as described for when the second inch character keys and addition keys 21 are depressed.

At some point in the addition of inches, or when the addition of fractions results in the transfer of a unit via impulse $a$ to the Inch Core 33, the sum of the inches will be equal or will be greater than 12.

When the second or subsequent inch character key is depressed, the momentary contact within the apparatus will cause the second or subsequent inch to be entered into the apparatus via Impulse 3a and retained in Inch Core 33. When the addition key 21 is depressed, a unit impulse will be transferred via impulse $b$ to the Primary Core 22 of the apparatus. At that time the unit, one, will be automatically added to whatever feet are retained within the Primary Core 22 of the apparatus while the remainder, if any, is retained in the Inch Core 33 of the apparatus.

Transfer of a unit, one, via impulse $b$ to the Primary Core 22 may be actuated by adding a fraction to the inches and fractions retained in Cores 33 and 44, respectively. The added fraction adds the unit, one, to the Inch Core 33 which, in turn, adds the unit, one, to the Primary Core 22, and the remainder, if any, of the additions of fractions is itself retained in the Fraction Core 44 of the apparatus.

Nearly simultaneously, depending on the operating speed of the apparatus, the sum of two Inches, plus the sum of two Fractions, will be recorded in the Primary Display 1 by appropriate means via Impulse 2a, in the Inch Display 1 by appropriate means via Impulse 3b, and in the Fraction Display 1 by appropriate means via Impulse 4b, while the sums are retained individually and respectively in the Primary Core 22 in the Inch Core 33 and in the Fraction Core 44. Continued addition of Inches and/or Fractions will, as described herein, automatically transfer one unit, via impulse $a$ to the Inch Core 33 and via impulse $b$ to the Primary Core 22 when the sum of inches and/or fractions equals or exceeds twelve and/or unity, respectively.

It should be noted, by reference to FIG. 2, that the Inch Keyboard 3 contains a character key with the number 12 etched on the upper surface of the key, representing 12 inches. This character key is included in the Inch Keyboard 3 for the convenience of the user when the user's reference dimensions are listed as 12 inches instead of 1 foot. When the character key representing 12 inches is depressed, a momentary contact is made within the apparatus and "12 inches" is entered into the Inch Core 33 via impulse 3a and is retained there until the addition key 21 is depressed. When the addition key 21 is depressed, making momentary contact within the apparatus, the "12 inches" retained in Inch Core 33 will, via impulse b, be transferred as one unit to the Primary Core 22 of the apparatus and one unit will automatically be added to whatever "feet" are retained in the Primary Core 22. Nearly simultaneously, as described hereinbefore, the sum of the Feet will be recorded in the Primary Display 1 by appropriate means via impulse 2b. The sum of feet will be retained in the Primary Core 22. Inasmuch as there will not be a representation of "12 " in the Inch Display 1 and there is no remainder from the addition of 12 inches, there will not be a retention of 12 in the Inch Core 33 of the apparatus. However, if the Inch Core 33 has previously retained one thru 11 inches, those inches will continue to be retained in the Inch Core 33 and will continue to be recorded in the Inch Display 1.

There are 10 Primary Keyboard Character Keys 0 thru 9 representing Feet, with the digits 0 thru 9 etched on the upper surface of the keys in Primary Keyboard 2. When initial Primary Character Keys (1 thru 9) are depressed, a momentary contact is made within the apparatus and the selected "feet" is entered into the apparatus via impulse 2a and is retained in Primary Core 22 until the addition key 21 is depressed. When the addition key 21 is depressed, making momentary contact within the apparatus, the selected "feet" retained in Primary Core 22 is, by appropriate means via impulse 2b, recorded in the Primary Display 1 while still being retained in the Primary Core 22 of the apparatus. When subsequent Primary keys are depressed, a momentary contact is made within the apparatus and the second and subsequent "feet" is entered into the apparatus via Impulse 2a and is retained in Primary Core 22 until the addition key 21 is depressed. When the addition key 21 is depressed, making momentary contact within the apparatus, the second and subsequent "feet" is automatically added to the "feet" retained in the Primary Core 22 and the sum of the "feet" is, by appropriate means via Impulse 2b, recorded in the Primary Display 1, while the sum of the "feet" is retained in the Primary Core 22.

In the manner described, the apparatus will be capable of adding feet, inches and fractions, retaining the sums in the appropriate Cores, and recording the sums in the appropriate displays. In adding feet, inches and fractions, it will not be necessary for the user to first add feet, then inches and then fractions, or similarly to first add fractions, then inches and then feet. It will be possible, as an object of the present invention, for the user to add feet, inches and fractions in any sequence and, thus, obtain the true sum of all feet, inches and fractions entered into the apparatus. In any sequence of entering feet, inches and fractions, the transfer of one unit will be accomplished from the Fraction Core 44 to the Inch Core 33 and from the Inch Core 33 to the Primary Core 22, as herein described.

The Constant Switch

The constant switch 35 will permit the apparatus to function in a similar manner as the constant found in most electronic calculators. When the constant switch 35 is placed in the "on" position denoted by the letter K embossed on the face of the apparatus, any Primary, or Feet, Inch, or Fraction entered into the apparatus in the appropriate Core by depressing one of the Feet, Inch or Fraction keys, as described herein, will be made a constant additive. The Feet, Inch, or Fraction thus entered into the apparatus via impulses 2a, 3a or 4a, will, respectively, be retained in the appropriate Cores. When the addition key 21 is depressed, making a momentary contact within the apparatus, the entered Feet, Inch, or Fraction, via impulses 2b, 3b or 4b, respectively, will be recorded in the Primary, Inch, and Fraction Displays 1, while being, respectively, still retained in the Primary Core 22, the Inch Core 33 or the Fraction Core 44. To achieve constant or repetitive addition, the user need only depress the addition key 21 and the entered Feet, Inches, or Fractions will automatically be added to themselves as often as the addition key 21 is depressed. Each time the addition key 21 is depressed, the sums of the additions will be recorded in the Primary, Inch or Fraction Displays 1. After initially entering the Feet, Inches or Fractions via impulses 2a, 3a or 4a, respectively, N additions will be obtained by depressing the addition key 21 N times. After each depression of the addition key 21, the sum of the additions of Feet, Inches or Fractions will be recorded in the Primary, Inch, or Fraction Displays 1. During the operation of constant or repetitive addition unit transfer from the Fraction Core 44 via impulse a to the Inch Core 33 and from the Inch Core 33 via impulse b to the Primary Core 22 will function as described hereinbefore. Constant or repetitive addition will function for Feet, Inches and Fractions, either individually, coupled, or all together.

Feet to Decimal Conversion Key

The Feet to Decimal conversion key 61 and the Decimal to Feet conversions key 62 will be used to automatically and directly convert Feet, Feet and Inches, Feet, Inches and Fractions or Feet and Fractions into decimal equivalents, and conversly; to convert a decimal numeric into Feet, Feet and Inches, Feet, Inches and Fractions or Feet and Fractions.

As described hereinbefore, Feet, Inches and Fractions will be entered into the apparatus via impulses 2a, 3a and 4a, respectively, and then recorded in the Primary, Inch and Fraction Displays 1 via Impulses 2b, 3b and 4b respectively. Any numeric entered in any one, any two, or all three displays 1 will be automatically and directly converted into decimal equivalent by depressing the Feet to Decimal Conversion Key 61. When the Feet to Decimal Conversion Key 61 is depressed, making momentary contact within the apparatus, the Feet, recorded in the Primary Display 1, by appropriate means via impulses m and t will be recorded in the Primary Display 1 with the decimal point positioned to two or four places as assigned by the Decimal Selector Switch 231. It will be recommended that all Conversions to decimal and metric measurement equivalents be to four decimal places. Note that the floating decimal cannot be used with any conversion key. Inasmuch as the apparatus will be provided with a zero supression capability, the converted Feet will be shifted in the Primary Display 1 so that there will be the assigned places to the right of the decimal point, but no zeros will be illuminated in the Primary Display 1 to the right of the decimal point.

Similarly, the Inches recorded in the Inch Display 1, by appropriate means via impulses *n* and *t*, will be recorded in the Primary Display 1 to the right of the decimal point, in decimal equivalent. And, again, similarly, the Fractions recorded in the Fraction Display 1, by appropriate means via impulses *o* and *t*, will be recorded in the Primary Display 1 to the right of the decimal pooint, in decimal equivalent.

Thus, the decimal equivalent of Feet, Feet and Inches, Feet Inches and Fractions or Feet and Fractions will be recorded in the Primary Display 1 automatically and directly by depressing the Feet to Decimal Conversion Key 61.

Decimal numerics will be entered into the apparatus by means of the Primary Keyboard 2. Depressing Primary character keys 0 thru 9 in any sequence with the decimal point character key depressed at the proper place during depression of the Primary Character keys 0 thru 9 will enter the numerics into the apparatus via impulse 2a, and will record the numerics in the Primary Display 1 via impulse 2b. Note that the maximum number of individual numerics or integers entered into the apparatus and displayed in the Primary Display 1 will be equal to or less than the number of "digits" available in the Primary Display 1 to be recorded. Should the user attempt to enter more than the maximum number of "digits" which the Primary Display 1 is capable of recording, the Error Indicator (not shown) will be illuminated and Conversion to Feet, Inches and Fractions will not be possible.

As described hereinbefore, it will be recommended that numerics entered into the Primary Display 1 be to four decimal places. Therefore, the maximum number of digits to the left of the decimal point will be four in an eight digit display although, if required, two place decimal can be used and the maximum number of digits to the left of the decimal point will be six in an eight digit display. This might be useful for certain conversions.

After the decimal numeric has been recorded in the Primary Display 1, said numeric will be converted to feet, inches or fractions by depressing the Decimal to Feet Conversion Key 62. When the Decimal to Feet Conversion Key 62 is depressed, making momentary contact within the apparatus, the decimal numeric recorded in the Primary Display 1, by appropriate means via impulse *t* and via impulses *m*, *n*, and *o* will be separated into equivalents of feet, inches and fractions and will be automatically and directly converted into feet, inches and fractions and will be recorded in the Primary Inch and Fraction Displays 1 as appropriate. Inasmuch as Feet, in decimal numeric, is recorded in the Primary Display 1 to the left of the decimal point, the recordation of feet as part of a Feet-Inch-Fraction numeric will occur in the Primary Display 1 beginning with the right-hand digit display in the Primary Display 1, in essence a shift to the right in the Primary Display 1.

It should be noted here that all numerics recorded in the Primary Display 1 will always begin at the right-hand digit display of the Primary Display 1, unless assigned otherwise by the position of the decimal point by means of the Decimal Selector Switch 231. Thus, the individual numbers 1 thru 9 will be recorded in the extreme right-hand digit display, the "tens" will appear in the second from right digit display, the "hundreds" will appear in the third from right digit display, and so on until all digit displays are accounted for. This feature of the apparatus is similar to currently available electronic calculators.

The impulses *t*, *m*, *n* and *o* will operate in reverse direction during conversion from Decimal to Feet compared to the described direction of said impulses during conversion from Feet to Decimal.

The preceding descriptions of conversions from Feet to Decimal equivalent and Decimal to Feet indicated the method by which numerics are entered into the apparatus and recorded in the Displays 1. For convenience in this disclosure, the numerics to be converted were entered into the apparatus and recorded in the Displays 1 as initial entries. The apparatus will be capable, by the method as specifically described, of converting from Feet to Decimal equivalent and from Decimal to Feet at any time said numerics are recorded in the Displays 1, whether by initial entry into the apparatus and recorded in the Displays 1, or whether recorded in the Displays 1 as a result of any arithmetic functions of addition, subtraction, multiplication or division or by use of other auxiliary function keys such as the square root key. Thus, regardless of the operations by which a numeric is recorded in the Displays 1, said numeric can be automatically and directly converted by use of any of the conversion keys: the Feet to Decimal Conversion Key 61, the Decimal to Feet Conversion Key 62, the Feet to Meters Conversion Key 71, the Meters to Feet Conversion Key 72, the Inches to Centimeters Conversion Key 81, or the Centimeters to Inches Conversion Key 82.

The Feet to Meters Conversion Key 71 and Meters to Feet Conversion Key 72 will be used, respectively, to automatically and directly convert Feet, Feet and Inches, Feet, Inches and Fractions or Feet and Fractions into metric measurement equivalents and conversely, to convert a metric measurement numeric into Feet, Feet and Inches, Feet, Inches and Fractions, or Feet and Fractions.

As described hereinbefore, for conversions using the Feet to Decimal Conversion Key 61 and the Decimal to Feet Conversion Key 62, the same method will be used to enter Feet, Inches and Fraction numerics into the apparatus via impulses 2a, 3a, and 4a, respectively, and to record said numerics in the Primary, Inch and Fraction Displays 1 via impulses 2b, 3b, and 4b, respectively. As also described hereinbefore, any numeric entered into the apparatus and recorded in the Display 1, either initially or as a result of other operations within the apparatus, will be capable of being converted from Feet, Inches and Fractions to metric measurement, and vice versa. The method hereinbefore described for Feet to Decimal Conversion will apply to Feet to Meters conversion with depression of the Feet to Meters Conversion Key 71 causing, via impulses *m*, *n*, *o* and *t*, the recordation of the metric measurement equivalent of feet, feet and inches, feet, inches and fractions, or feet and fractions in the Primary Display 1. The selection and positioning of the decimal point will also be similar to the method described hereinbefore for Feet to Decimal conversion.

The method hereinbefore described for Decimal to Feet Conversion will apply for Meters to Feet conversion with Meters recorded in the Primary Display 1 via impulse 2b and with depression of the Meters to Feet Conversion Key 72 causing, via impulses *t*, *m*, *n* and *o*, the recordation of the feet, inch and fraction equivalent of the metric numeric, in the Primary, Inch, and Fraction Displays 1, as appropriate.

The Inches to Centimeters Conversion Key 81 and the Centimeters to Inches Conversion Key 82 will be used, respectively, to automatically anddirectly convert Inches or Inches and Fractions into centimeters in metric measurement and conversely, to convert a centimeter numeric into Inches or Inches and Fractions.

As described hereinbefore for conversions of Feet to Decimal, Decimal to Feet, Feet to Meters, and Meters to Feet, the method will similarly apply for conversions of Inches to Centimeters and Centimeters to Inches, except that the impulses will be different.

After Inches and/or Fractions have been entered into the apparatus via impulses 3a and 4a, respectively, and have been recorded in the Inch Display 1 and Fraction Display 1 via impulses 3b and 4b, respectively, conversion to centimeters in metric measurement will be accomplished by depressing the Inches to Centimeters Conversion Key 81. Via impulses p and/or q and t, Inches and/or Fractions will be automatically and directly converted to centimeters, which will be recorded in the Primary Display 1. As also hereinbefore described the decimal point will be appropriately positioned.

In a similar manner, after centimeters have been recorded in the Primary Display 1 via impulse 2b, depression of the Centimeters to Inches Conversion Key 82 will cause, via impulses t, p and/or q, the recordation of Inches and/or Fractions in the Inch Display 1 or Fraction Display 1, as appropriate.

The Clear Key 24 will clear all data entered into the apparatus, except memories which will be described later in this disclosure.

The Clear Entry Key 25 will clear only the last individual piece of data entered into the apparatus.

The Percent Key 26 and the square root key 27 will function in a similar manner to those in currently available electronic calculators.

Subtraction

Figure 4:
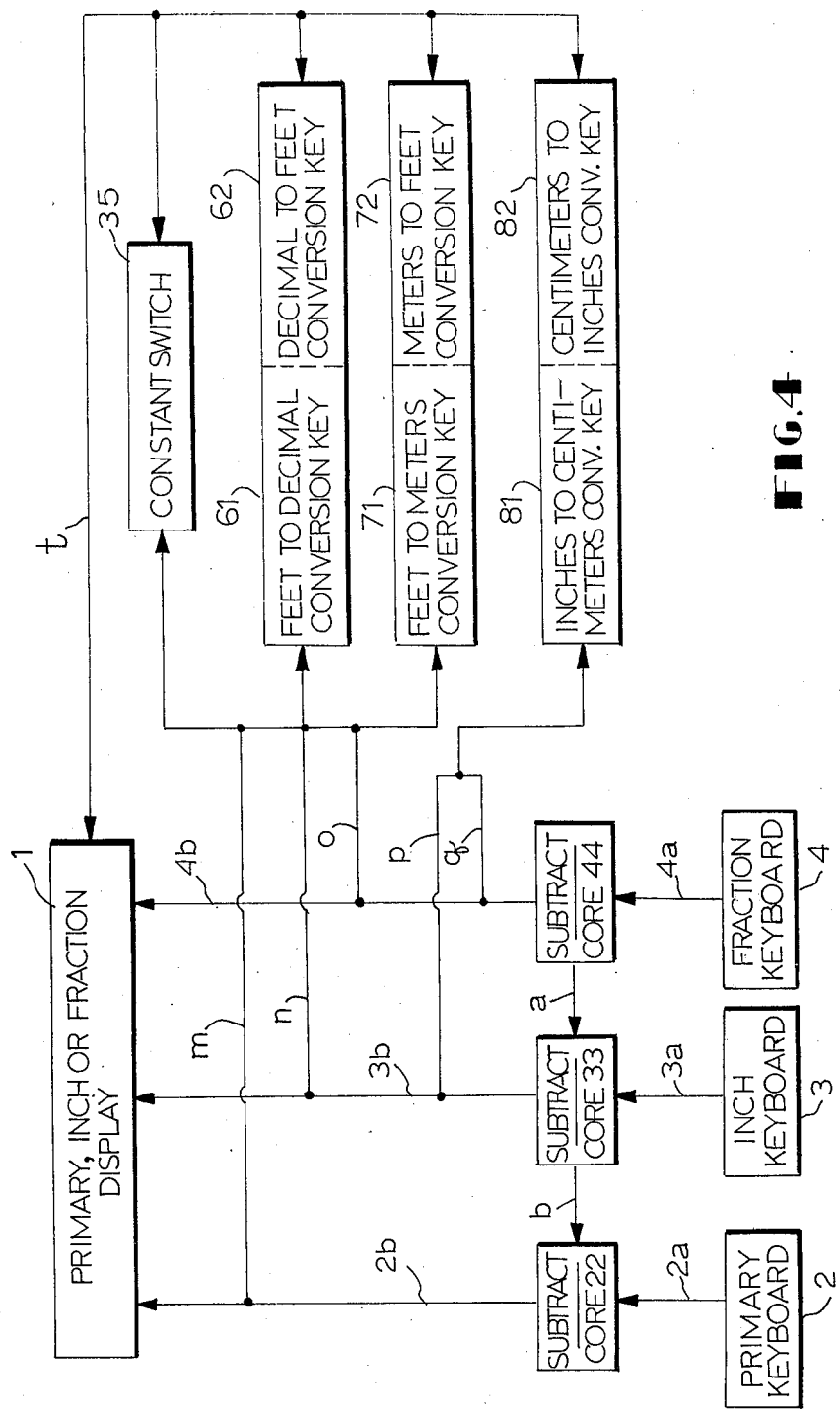
FIG. 4 is a block diagram illustrating the apparatus for performing subtraction.

FIG. 4 is a block diagram illustrating the method by which subtraction of feet, inches and fractions will be performed in the apparatus. The detailed disclosure of addition hereinbefore described will be applicable for subtraction, except that the subtraction key 21 will be used instead of the addition key 21. When numerics have been entered into the apparatus via impulses 2a, 3a, and 4a, these same numerics will be recorded in the Displays 1 after the subtraction key 21 has been depressed. When the subtraction key 21 is depressed, making momentary contact within the apparatus, the specific feet, inches and fractions retained, respectively, in the Primary Core 22, the Inch Core 33 and the Fraction Core 44 will be recorded, respectively, in the Primary Display, the Inch Display, and the Fraction Display. Note that the Negative Sign indicator (not shown) will be activated. Continued and repeated depression of Primary, Inch, and Fraction Keys will enter, respectively, Feet, Inches, and Fractions into the apparatus. When the subtraction key 21 is depressed, making momentary contact within the apparatus, the newly entered Feet, Inches, and Fractions will be automatically subtracted from the previously entered Feet, Inches and Fractions. Note that the continued subtractions are actually the sums of negative numbers, and so each repeated subtraction is, in fact, the arithmetic sum of two numerics, with a negative sign. For convenience of this disclosure, the terms negative feet, negative inches and negative fractions will be used to represent subtraction.

At some point in the subtraction of fractions, whether by depressing the second or subsequent fraction character keys 4 and the subtraction key 21, the sum of the negative fractions will be equal to or will exceed unity, and will be negative. When the second or subsequent fraction character key 4 is depressed, the momentary contact within the apparatus will cause the second or subsequent negative fraction to be entered into the apparatus via impulse 4a and will be retained there in Fraction Core 44. When the subtraction key 21 is depressed, a negative unit impulse will be transferred via impulse a to the Inch Core 33 of the apparatus. At that time the unit, one, will be automatically subtracted from whatever inches are retained within the Inch Core 33 of the apparatus while the remainder, if any, is retained in the Fraction Core 44 of the apparatus.

Nearly simultaneously, depending on the operating speed of the apparatus, the sum of the two negative fractions will be recorded in the Inch Display 1, via impulse 3b, and in the Fraction Display 1, via impulse 4b, while the sums are retained, individually and respectively, in the Inch Core 33 and in the Fraction Core 44. Continued subtraction of fractions will, as described herein, automatically transfer one negative unit, via impulse a, to the Inch Core 33 when the sum of negative fractions equals or exceeds unity.

Similarly, in the subtraction of inches, at some point the sum of the negative inches will be equal to or will exceed 12, and will be negative. When second or subsequent inch character keys are depressed, the momentary contact within the Apparatus will cause the second or subsequent negative inch to be entered into the apparatus via impulse 3a and will be retained there in Inch Core 33. When the subtraction key 21 is depressed, a negative unit impulse will be transferred via impulse b to the Primary Core 22 of the apparatus. At that time the unit, 1, will be automatically subtracted from whatever feet are retained within the Primary Core 22 of the apparatus while the remainder, if any, is retained in the Inch Core 33 of the apparatus.

Nearly simultaneously, depending on the operating speed of the apparatus, the sum of the 2 negative inches will be recorded in the Primary Display 1, via impulse 2b, and in the Inch Display 1, via impulse 3b, while the sums are retained, individually and respectively, in the Primary Core 22 and in the Inch Core 33. Continued subtraction of inches will, as described herein, automatically transfer one negative unit, via impulse b to the Primary Core 22 when the sum of negative inches equals or exceeds 12.

Transfer of a negative unit, one, via impulse b to the Primary Core 22 may be actuated by subtracting a fraction from the inches and fractions retained in Cores 33 and 34, respectively. The subtracted fractions subtracts the unit, one, from the Inch Core 33 which, in turn, subtracts the unit one from the Primary Core 22 and the remainder, if any, of the subtractions of fractions is itself retained in the Fraction Core 44 of the apparatus. Recordation of Feet, Inches and Fractions in appropriate Displays 1 will be as hereinbefore described.

As hereinbefore described, the number twelve character key in the Inch Keyboard 3 will function in the same manner during subtraction as during addition, except that the subtraction, being negative, will reduce recorded feet by one unit, while inches retained in Inch Core 33 will continue to be retained and will continue to be displayed.

As hereinbefore described, Feet will be represented by the Primary Keyboard 2 and subtraction of feet will be accomplished in the same manner as addition of feet, but by use of the subtraction key 21. Representation of negative feet in the Primary Display 1 will be indicated by the Negative Sign Indicator (not shown).

The functioning of the apparatus by use of auxiliary keys and switches during subtraction, by use of negative numbers, will be the same as that function described for addition, and the representation of negative numerics will be indicated by the Negative Sign Indicator (not shown). Negative feet, inches and fractions may be used as constants, may be converted to and from negative decimal equivalents and may be converted to and from negative metric equivalents. The clear key 24, the clear entry key 25, the precent key 26 and the square root key 27 will function as hereinbefore described.

Note that, as also hereinbefore described, the equals (=) function key 21 will not be used to finalize the sums of subtractions of two or more fractions. The sums of two or more negative feet, inches and fractions will be cumulatively recorded in the Displays 1.

Division

Figure 5:
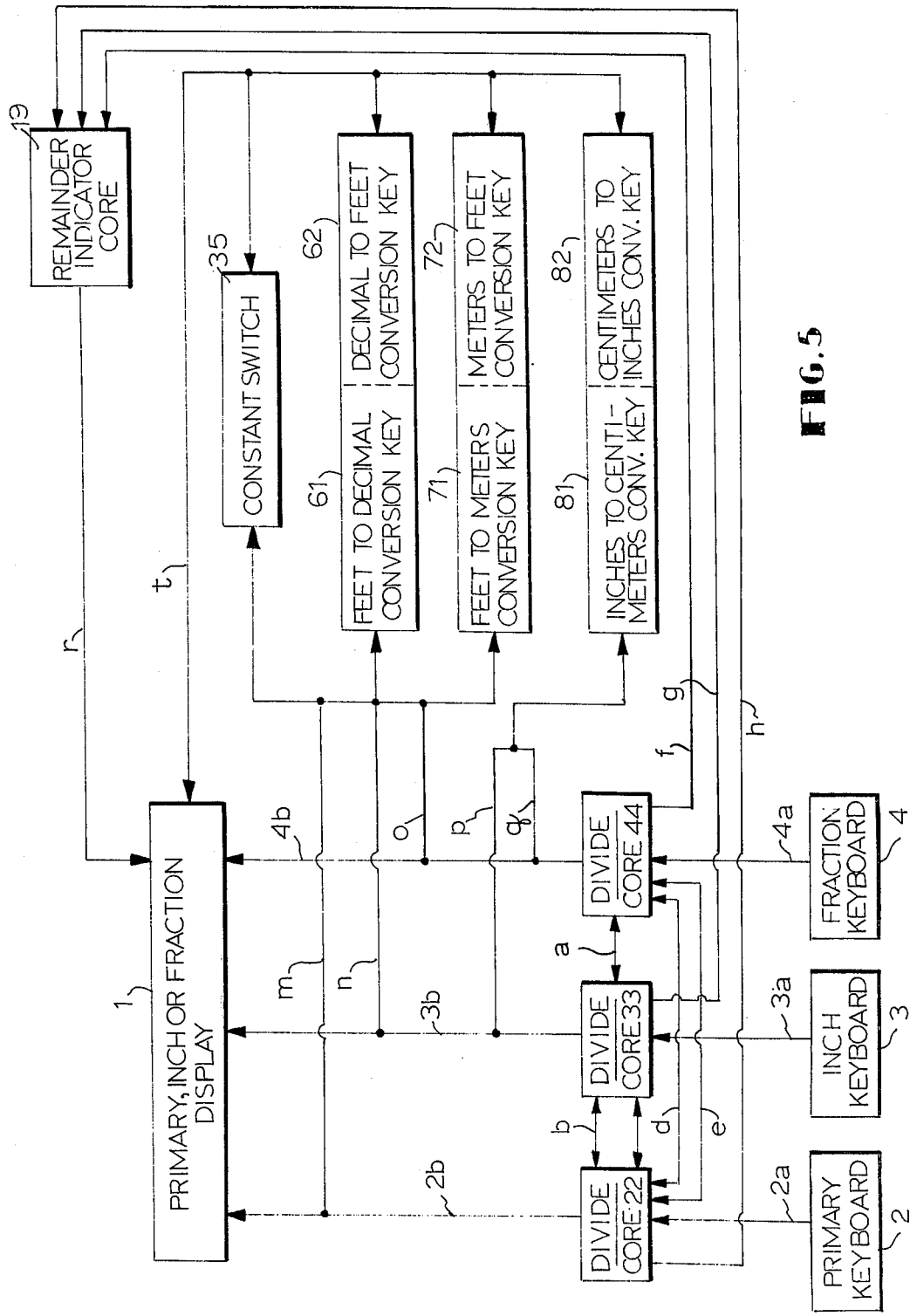
FIG. 5 is a block diagram illustrating the apparatus for performing division.

FIG. 5 is a block diagram illustrating the method by which division of feet, inches and fractions will be performed in the apparatus.

There will be twenty-two categories of division, as follows:
1. Feet by Inches
2. Feet by Fractions
3. Feet by Inches and Fractions
4. Feet by Decimal numbers
5. Inches by Fractions
6. Inches by Decimal numbers
7. Fractions by Decimal numbers
8. Feet and Inches by Inches
9. Feet and Inches by Fractions
10. Feet and Inches by Decimal numbers
11. Feet and Inches by Inches and Fractions
12. Feet and Fractions by Fractions
13. Feet and Fractions by Inches and Fractions
14. Feet and Fractions by Decimal numbers
15. Inches and Fractions by Fractions
16. Inches and Fractions by Decimal numbers
17. Feet, Inches and Fractions by Fractions
18. Feet, Inches and Fractions by Decimal numbers
19. Feet, Inches and Fractions by Feet, Inches and Fractions
20. Feet, Inches and Fractions by Feet and Inches
21. Feet, Inches and Fractions by Feet and Fractions
22. Feet, Inches and Fractions by Inches and Fractions Category (4), Feet by Decimal numbers is actually Decimal number by Decimal number inasmuch as Feet is represented by the Primary Keyboard 2 and in the Primary Display 1. This category of division is possible in currently available electronic calculators. It is an object of the present invention to be capable of performing division under categories (1) thru (3) and (5) thru (22). Metric Measurement Numerics are actually decimal numbers and division by metric numerics will fall under category (4).

Decimal numbers are defined for the purposes of this section of the disclosure to be numerics without decimal points; that is, whole numbers.

For the purposes of this disclosure, the dividend will be a single numeric or numerics recorded in the Displays 1; the divisor will be a single numeric or numerics entered into the apparatus and retained in Primary Core 22, Inch Core 33 and Fraction Core 44. The quotient of the function of division will be recorded in the Primary, Inch and Fraction Displays 1, as appropriate. Any numerics recorded in the Displays 1, whether by initial entering or by the result of other operations of the apparatus, will be a dividend and capable of being divided by a divisor as hereinafter described.

Inasmuch as division will not always be exact, provision will be made in the apparatus to retain and record the final "remainder". This will be accomplished by retaining the final remainder in the Remainder Core 19 and by recording the final remainder in the Primary, Inch and Fraction Displays 1. A remainder indicator 9 light will be actuated to alert the user of the apparatus that there is a final remainder. The quotient of the division, having been recorded in the Display 1, will be cleared from the Display when an appropriate key is depressed, making momentary contact within the apparatus, which will cause the final remainder to be recorded in the appropriate display, as hereinafter described.

Any numeric or numerics recorded by any means in the Display 1 will also be retained in the Primary Core 22, Inch Core 33 and Fraction Core 44. Depression of the division key 21 will establish the sequence of impulses, $a, b, c, d, e$, between the cores. The divisor will be entered into the apparatus via impulses $2a$, $3a$ and $4a$, as appropriate, and will be retained in the Primary Core 22, Inch Core 33 and Fraction Core 44. When the Equals key 21a is depressed, making momentary contact within the apparatus, the dividend will be divided by the divisor, via impulses $a, b, c, d$ and $e$. The dividend, previously recorded in the Displays 1, will be automatically cleared from the Displays 1, and the quotient will be recorded in the Display 1, via impulses $2b$, $3b$ and $4b$. Should there be a final remainder as a result of division, the final remainder will be transferred, via impulses $f, g$, and $h$, to be Remainder Core 19, at which time the remainder indicator 9 will be actuated in the Display 1.

Depression of the equals key 21a, making momentary contact within the apparatus, will cause the final remainder, retained in Remainder Core 19, via impulse $r$, to be recorded in the Display 1.

Impulses $a, b, c, d$ and $e$, between the Primary Core 22, Inch Core 33 and Fraction Core 44 are indicated to be two-directional. One direction will serve to divide a fraction into an inch via impulse $a$, to divide a fraction into feet via impulse $d$, to divide an inch into feet via impulse $b$, to divide a decimal numeric into an inch via impulse $c$ and to divide a decimal number into a fraction via impulse $e$.

Use of the same impulses will allow division of feet by Inches and Fractions, Feet and Inches by fractions, and so on as described hereinbefore for the various categories of division.

During some divisions, there will be internal or sub-remainders. These sub-remainders will occur, for example, when feet and inches are divided by decimal numerics. The division may result in there being a sub-remainder of say, 1 foot. The 1 foot, equal to 12 inches, would be transferred via impulse b, to the inch core 33 and the number 12 would be automatically added to whatever inches are retained in the Inch Core 33. Thus, the Inch Core 33 will retain, considering the present example, from 12 to 23 inches. The division will continue with the inches (12 to 23) retained in the Inch Core 33 divided by the decimal numerics. In such case, the division may be exact and there will be no final remainder or there may be a final remainder which, via impulse g, would be retained in Remainder Core 19 with the Remainder Indicator 9 actuated in the display 1, and the final remainder would be recorded in the Display 1 as hereinbefore described.

Similarly, inches and fractions divided by a decimal numeric could result in a sub-remainder of 1 inch, for example, in which case eight-eighths would be transferred via impulse a to the Fraction Core 44 and the eight-eithths would be automatically added to whatever eighths are retained in the Fraction Core 44. Thus, the Fraction Core 44 will retain, considering the present example, from eight to fifteen eighths. The division will continue with the fractions retained in the Fraction Core 44 divided by the decimal numeric. As described hereinbefore in the prior example a final remainder, if any, will be recorded in the Display 1.

In some cases, for example dividing Feet and Fractions by a decimal numeric, the transfer of 12 inches from Primary Core 22 to Inch Core 33 will create inches where none were previously entered into the apparatus and recorded in the Display 1.

The same principal will be applicable for many of the division categories enumerated hereinbefore, with the transfer of multiples of 12 inches from the Primary Core 22 to the Inch Core 33 and with the transfer of multiples of eight-eighths from the Inch Core 33 to the Fraction Core 44.

The functioning of the apparatus by use of auxiliary keys and switches during division will be the same as that function described for addition. The quotient recorded in the Displays 1, as long as there is no final remainder, will be capable of operations with the use of the present key 26, square root key 27, constant switch 35 and conversion keys 61, 62, 71, 72, 81 and 82. When a final remainder occurs and is recorded in the Display 1 by use of the equals key 21a, the quotient will be cleared from the apparatus. To continue use of the apparatus for any function, the final remainder will have no significance and the apparatus must be cleared by use of the Clear key 24. If, in division, an erroneous divisor is entered into the apparatus, said divisor can be cleared by use of the clear entry key 25 without affecting the dividend retained in the Primary Core 22, Inch Core 33 and Fraction Core 44 and recorded in the Display 1.

For division involving feet, inches and fractions, the Operation Selector Switch 66 must be set at FT/IN. The Decimal Selector Switch 231 will have no effect on the function of division involving inches and fractions and so may rest in any position. It should be noted here that, as described hereinbefore, division by decimal numeric will be confined to division by whole numbers. Should the user attempt to divide a numeric including inches and fractions by a numeric with a decimal point, the Error Indicator (not shown) will be actuated. Thus, should the user, using Primary Keyboard 2, depress in sequence character keys representing any numeric, followed by depressing the decimal point Character Key 23, the apparatus will be capable of performing division. However, after depressing the decimal point Character Key 23, depressing any other character key will actuate the Error Indicator (not shown) and an interlock within the apparatus ;will prevent the equals key 21afrom being depressed.

Multiplication

Figure 6:
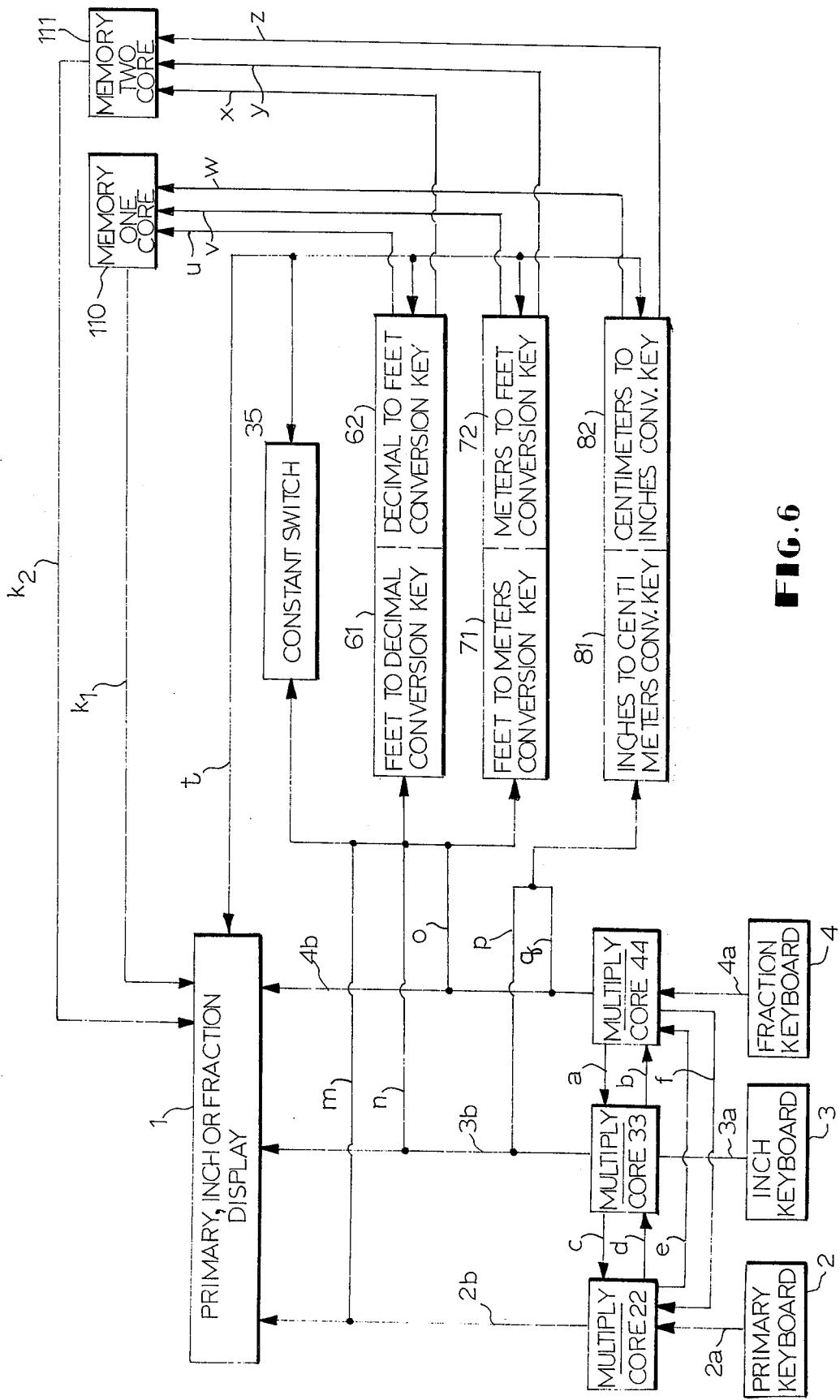
FIG. 6 is a block diagram illustrating the apparatus for performing multiplication.

FIG. 6 is a block diagram illustrating the method by which multiplication of feet, inches and fractions will be performed in the apparatus.

One of the important considerations in multiplication is in the presentation of the result. Multiplication of one feet, inch and fraction numeric by another feet, inch and fraction numeric will result in an answer normally referred to as "square feet" or "square inches", commonly termed "area". However, area might not always be exactly N square feet or N square inches. It also might not be exactly $N + 1$ square feet or $N + 1$ square inches but may fall between N and $N + 1$, for example between 1 and 2. It is the representation of that portion of the numeric between N and $N + 1$ which is of importance. That portion, for convenience in this disclosure, is termed "fractional", a fraction of unity.

A specific example will best illustrate the representation of fractional area: while an area may be called 1¼ square feet, the most common form of presentation is to call the area 1.25 square feet. Area is almost invariably referred to in decimal terms when representing feet, inches and fractions.

An object of this invention is to present the product of multiplication of one feet, inch and fraction numeric by another feet, inch and fraction numeric in decimal form. The apparatus will have two means to accomplish this object. First, by direct multiplication of one feet-inch-fraction numeric by another feet-inch-fraction numeric followed by conversion of the product, in feet-inch-fraction numeric, to decimal equivalent and second, by conversion of each feet-inch-fraction numeric to decimal equivalent and then by multiplying one decimal equivalent by the other decimal equivalent. To accomplish this object, the Feet to Decimal Conversion Key 61 and two memories, Memory One and Memory Two have been provided in the apparatus, with each memory having its own memory core, referred to herein as Memory One Core 110 and Memory Two Core 111.

As described hereinbefore, a Feet-Inch-Fraction numeric (Feet, Inches and Fractions, Feet and Inches, Feet and Fractions, or Inches and Fractions) will be entered into the apparatus via impulses 2a, 3a and 4a, as appropriate. The Feet-Inch-Fraction numeric will be retained in the Primary Core 22, the Inch Core 33 and the Fraction Core 44 and, by depressing the multiplication key 21, the feet-inch-fraction numeric, via impulses 2b, 3b and 4b, will be recorded in the Primary Display, the Inch Display and the Fraction Display 1. Also, as hereinbefore described, a Feet-Inch-Fraction numeric can be retained in the cores 22, 33, 44 and recorded in the Displays 1 as the result of other functions of the apparatus. Thus, any Feet-Inch-Fraction numeric retained in Cores 22, 33, 44 and recorded in Display 1 can be a multiplicand.

To multiply a multiplicand by a Feet-Inch-Fraction multiplier, first the multiplication key 21 is depressed and the sequence of impulses a, b, c, d, e and f between the Primary Core 22, Inch Core 33 and Fraction Core 44 will be established. The multiplier will be entered into the apparatus via impulses 2a, 3a and 4a as appropriate and will be retained in the Primary Core 22, Inch Core 33 and Fraction Core 44. When the equals key 21a is depressed, making momentary contact within the apparatus, the multiplicand will be multiplied by the multiplier via impulses a, b, c, d, e and f, the multiplicand, previously recorded in the Displays 1, will be automatically cleared from the Displays 1 and the product will be recorded in the Displays 1 via impulses 2b, 3b and 4b. The product thus recorded will be in Feet, Inches and Fractions and, as stated above, is not considered a valid representation of area. Therefore, the Feet-Inch-Fraction numeric must be converted to decimal equivalents, and this conversion is accomplished by use of the Feet to Decimal Conversion Key 61 as hereinbefore described.

During multiplication, there will be internal additions of inches and fractions. These additions will occur, for example, when inches and fractions are multiplied by decimal numerics. The multiplication of inches by a decimal numeric may result in a total of inches greater than 11. When that occurs, any total of inches which is equal to or greater than a multiple of 12 will be added via impulse c, as one or more units (total inches divided by 12) to whatever feet are retained in the Primary Core 22, with the remainder of inches, eleven or less, being retained in the Inch Core 33. Similarly, the multiplication of fractions by a decimal numeric may result in a total of eighths (of an inch) greater than seven. When that occurs, any total of fractions (in eighths which is equal to or greater than a multiple of eight will be added, via impulse a, as one or more units (total eights divided by eight) to whatever inches are retained in the Inch Core 33 with the remainder of eighths of an inch, seven or less, being retained in the Fraaction Core 44.

The multiplication of fractions and inches by decimal numerics will be performed in the apparatus so that whenever the multiplication of fractions transfers, via impulse a, sufficient units to the Inch Core 33 to create within the Inch Core 33a sum of inches 12 or greater, a unit, one, will automatically be transferred to the Primary Core 22 via impulse c.

Thus, it can be seen that multiplication will involve the transfer of units from the Fraction Core 44 to the Inch Core 33 and from the Inch Core 33 to the Primary Core 22. Multiplication of Feet-Inch-Fraction numerics by decimal numerics or by another Feet-Inch-Fraction numeric will result in a product determined by sequential operations via impulses a, b, c, d, e and f in such a manner as to add units to appropriate cores and upon depressing the equals key 21a to record the product in the appropriate Displays 1.

The alternate method of multiplying one Feet-Inch-Fraction numeric by another Feet-Inch-Fraction numeric, as hereinbefore described, requires conversion of each Feet-Inch-Fraction numeric into decimal equivalents by use of the Feet to Decimal Conversion Key 61. Also, as hereinbefore described, any numeric recorded in the Displays 1 can be considered the multiplicand and by virtue of its being so recorded in the Displays 1 can be converted into decimal equivalent by use of the Feet to Decimal Conversion Key 61. Once conversion to decimal equivalent is accomplished, the decimal equivalent, recorded in the Primary Display 1, will be the multiplicand. For the apparatus to function in multiplication, the multiplier must then be entered into the apparatus. The Multiplier, however, will be a Feet-Inch-Fraction numeric and it must also be converted to decimal equivalent. To be converted, the multiplier must itself be entered into the apparatus and recorded in the Displays. This can be accomplished by considering the multiplier as a new multiplicand and, by depressing the appropriate character keys in Keyboards 2, 3 and 4, the Feet-Inch-Fraction numeric will be entered into the Primary Core 22, the Inch Core 33 and the Fraction Core 44. Then, by depressing the multiplication key 21, the Feet-Inch-Fraction numeric will be recorded in the Primary, Inch and Fraction Displays 1. However, depressing the multiplication key 21 will automatically clear the Displays 1 including the numeric previously recorded as the multiplicand in decimal equivalent. To retain the prior multiplicand, the user would have to either memorize or write down the numeric. To avoid such necessity, the memories have been provided in the apparatus.

In the alternate method herein described, in order to convert both Feet-Inch-Fraction numerics into decimal equivalent prior to the actual multiplication, the first entered and recorded Feet-Inch-Fraction numeric will be converted into decimal equivalent by depressing the feet-to-decimal Conversion Key 61, following the method hereinbefore described. The decimal numeric thus recorded in the Primary Display 1 will be entered into Memory One Core 110, by appropriate means via impulse u, by depressing the M + 1 character key in Keyboard 110. Simultaneously, the Memory Indicator Light 101 will be illuminated to indicate that a numeric has been entered into and is retained in Memory One Core 110. Entering a numeric into Memory One Core 110 will automatically clear all Displays 1, Primary Core 22, Inch Core 33 and Fraction Core 44.

At this point, the Feet-Inch-Fraction numeric multiplier can be entered into the apparatus via impulses 2a, 3a and 4a, retained in the Primary Core 22, Inch Core 33 and Fraction Core 44, respectively, and can be recorded in the Primary Display, Inch Display and Fraction Display 1 as appropriate by depressing the multiplication key 21, or by any one of the other three function keys 21. Having been recorded in the appropriate Displays 1, the Feet-Inch-Fraction numeric can be converted to decimal equivalent by depressing the Feet to Decimal Conversion Key 61 and the Decimal equivalent will be recorded in the Primary Display 1. Note that the decimal equivalent will also be retained in the Primary Core 22.

Thus, the last decimal numeric recorded in the Primary Display 1 will be considered the multiplicand. By depressing the multiplication key 21, the apparatus will be ready to receive the multiplier. However, the multiplier is already retained in the apparatus, specifically in Memory One Core 110 where the first decimal equivalent was entered as hereinbefore described. When the MR1 key in Keyboard 110 is depressed, the multiplicand will be multiplied by the multiplier and the product retained in Primary Core 22. When the MR1 key is depressed, the decimal numeric retained in Memory One Core 110 will be transferred via impulse $K1$ to the Primary Display 1 and to the Primary Core 22 via impulse 2b, in reverse, but will still be retained in Memory One Core 110. When the equals key 21a is depressed, making momentary contact within the apparatus, the product will be recorded in Primary Display 1, will be retained in Primary Core 22 and Memory One Core 110 will automatically be cleared.

It should be noted here that determination will have to be made when Feet-Inch-Fraction numerics are converted to decimal equivalents as to where the decimal point is to be positioned. Therefore, the user will set the Decimal Selector Switch 231 at the appropriate position. It will be recommended that for multiplication of decimal numerics, the Decimal Selector Switch 231 be set at 4 places although, depending on the magnitude of the Feet-Inch-Fraction numerics, two places might be appropriate.

It will also be possible to enter the multiplier, converted into decimal equivalent, into Memory Two Core 111, via impulse $x$, and then to multiply the two decimal numerics retained within the two Memory Cores 110, 111 by each other, that is, the multiplicand retained in Memory One Core 110 by the multiplier retained in Memory Two Core 111.

This will be accomplished in the following manner: The decimal numeric retained in Memory One Core 110 will be recorded in the Primary Display 1 via impulse $k1$ when the MR1 key is depressed, making momentary contact within the apparatus. That decimal numeric will also be transferred to the Primary Core 22 via impulse $2b$, in reverse, and will be considered the multiplicand. The decimal numeric retained in Memory Two Core 111 will not become the multiplier. The user will not depress the multiplication key 21, thus establishing the sequence for multiplication in Primary Core 22. When the MR2 key is depressed, making momentary contact within the apparatus, the decimal numeric retained in Memory Two Core 111 will be recorded via impulse $k2$ in the Primary Display, at which time the prior decimal numeric is cleared from the Primary Display 1, but will still be retained in the Primary Core 22. The multiplier decimal numeric will also be transferred to Primary Core 22 via impulse $2b$, in reverse, and the multiplicand will be multiplied by the multiplier. When the equals key 21a is depressed, making momentary contact within the apparatus, the product will be recorded in the Primary Display 1 via impulse $2b$ and will also be retained in the Primary Core 22.

The product recorded in Primary Display 1 and retained in Primary Core 22 will be the decimal numeric termed "area". This decimal numeric will be useful as a multiplicand when the user wishes to determine "Volume", in cubic feet, which will be described hereinafter.

In a very similar manner to the method described hereinbefore of converting two Feet-Inch-Fraction numerics to decimal equivalents and of multiplying the two decimal numerics which have been retained in Memory One Core 110 and Memory Two Core 111, respectively, will also apply when the user wishes to convert Feet-Inch-Fraction numerics to metric measurement equivalents, both in meters and in centimeters.

For conversion of Feet-Inch-Fraction numerics to metric measurement equivalents, the Feet to Meters Conversion Key 71 will be depressed, as hereinbefore described. The metric measurement numeric, which will be in decimal form, will be entered into Memory One Core 110 by depressing the key M + 1 key in Keyboard 110 and the metric measurement numeric will be entered into Memory One Core 110 via impulse $v$. Similarly, a metric measurement numeric can be entered into Memory Two Core 111 via impulse $y$.

And in a similar manner, Inch-Fraction numerics can be entered into Memory One Core 110 via impulse $w$ and into Memory Two Core 111 via impulse $z$.

Multiplication of metric measurement numerics, meters or centimeters, will be accomplished by means of depressing, in sequence as described hereinbefore, the MR1 key, the multiplication key 21, the MR2 key and the equals key 21a. The product of said multiplications will be recorded in the Primary Display 1 and retained in the Primary Core 22 and, if required, will be considered the multiplicand when the user wishes to determine "volume", in cubic meters or in cubic centimeters.

The determination of volume, that is, area times height, recorded as cubic feet, cubic inches, cubic meters or cubic centimeters can easily be obtained by following the procedure described hereinbefore. The area determined, square feet, square inches, square meters or square centimeters, can be considered as one multiplier and can be entered into Memory One Core 110 as hereinbefore described. The second multiplier, a Feet-Inch-Fraction numeric, can be converted to the equivalent in decimal numeric, the equivalent in meters or the equivalent in centimeters. These equivalents can be entered into Memory Two Core 111 as hereinbefore described and then, by depressing the appropriate keys in sequence: MR1 key, multiplication key 21, MR2 key and equals key 21a, the product will be recorded in the Primary Display 1 and will be retained in the Primary Core 22.

The use of the memories has been indicated as being of prime importance during the function of multiplication. Many electronic calculators currently available have a "memory" and the present invention will be capable of functioning in a similar manner for other functions such as addition, subtraction, division or taking a percent. The present invention, with two memories, will have greater capabilities than electronic calculators currently available with only one memory. The present invention will, by nature of its similarity to electronic calculators currently available, be able to perform "chain" and "mixed" calculations, where numerics entered are in feet, inches and fractions of an inch. Included in the present invention will be those specialized features found in currently available electronic calculators such as a clock circuit to provide the timing base for operations which must operate in a sequenced manner, integrated circuits, control mechanisms, registers, decoders and segment converters.

The present invention will have three possible sources of power. One will be electric, 110 volt 60 cycle, "household" current. The second will be with use of rechargeable batteries. The third will be by use of commonly available "throw-away" alkaline or similar batteries.

While preferred features of the present invention have been described herein, and several variable features have also been described herein, it will be obvious that specific auxiliary features described herein could be omitted and additional features could be provided without departing from the scope and spirit of the present invention. For example, totals of additive and subtractive functions need not be cumulatively recorded in the Displays 1, but could be individually recorded and totaled upon depression of the equals key 21a, and that a printing mechanism could be provided to operate with or without simultaneous recordation of numerics in the Displays 1 to record on paper tape each of the entered and recorded numerics and the functions performed in the apparatus.

It is intended that all matter and descriptions contained in the above description or shown in the accompanying drawings shall not be interpreted as limiting in any way.

I claim:

1. A computing apparatus contained within a housing, comprising:
   a display console consisting of three separate and distinct displays to record the results of specified computations;
   a first keyboard having a plurality of character keys representing the digits 0 through 9;
   primary function keys representing the arithmetic functions of addition, subtraction, multiplication and division;
   a key representing an "equals" function;
   a key representing a decimal point;
   a key representing a "clear all" function;
   a key representing a "clear last entry" function;
   a key representing a percent function;
   a key representing a square root function;
   a second keyboard having a plurality of character keys with the 12 character keys representing the digits 1 through 12 representing, respectively, 1 through 12 inches;
   a third keyboard having a plurality of character keys with the character keys representing the identified fractions of ⅛, ¼, ⅜, ½, ⅝, ¾ and ⅞;
   an array of switches, including an "on/off" switch, a constant switch, a decimal selector switch, an operation selector switch;
   conversion keys, including a feet-to-decimal conversion key, a decimal-to-feet conversion key, a feet-to-meters conversion key, a meters-to-feet conversion key, an inches-to-centimeters conversion key, a centimeters-to-inches conversion key;
   memory utilization means, including a plurality of keys representing the "memory" functions of entering positive numerics into memory, entering negative numerics into memory, recalling numerics entered into memory, clearing numerics entered into memory.
   an indicator light to indicate when numerics have been entered into a memory;
   an indicator light to indicate when numerics have been entered into another memory; and
   a power source for driving the computing apparatus.

2. An apparatus according to claim 1, including means for automatically performing the arithmetic function of addition when the numerics entered into the apparatus are "feet", "inches" and "fractions of an inch" and when numerics entered into the apparatus are decimal numerics, and which includes means for automatically recording in the display the result of said arithmetic function of addition.

3. An apparatus according to claim 1, including means for automatically performing the arithmetic function of subtraction when the numerics entered into the apparatus are "feet", "inches" and "fractions of an inch" and when numerics entered into the apparatus are decimal numerics, and which includes means for automatically recording in the display the result of said arithmetic function of subtraction.

4. An apparatus according to claim 1, including means for automatically performing the arithmetic function of division when the numerics entered into the apparatus are "feet", "inches" and "fractions of an inch" and when numerics entered into the apparatus are decimal numerics, and which includes means for automatically recording in the display the result of said arithmetic function of division.

5. An apparatus according to claim 4, further including means for automatically recording in the displays the remainder of the arithmetic function of division when the quotient of the dividend divided by the divisor is not exact.

6. An apparatus according to claim 1, including means for automatically performing the arithmetic function of multiplication when the numerics entered into the apparatus are "feet", "inches" and "fractions of an inch" and when the numerics entered into the apparatus are decimal numerics, and which will automatically record in the displays the result of said arithmetic function of multiplication.

7. An apparatus according to claim 1, including means for automatically performing arithmetic functions of addition, subtraction, multiplication and division in a repetitive manner when the first entered numeric is made a constant.

8. An apparatus according to claim 1, including means for automatically positioning the decimal point in the numeric recorded in the display in accordance with the position assigned by the decimal selector means, and for positioning said decimal point in the display in accordance with the general mathematical laws of decimal positioning based on the arithmetic function being performed.

* * * * *

UNITED STATES PATENT AND TRADEMARK OFFICE
CERTIFICATE OF CORRECTION

PATENT NO. : 3,973,113
DATED : August 3, 1976
INVENTOR(S) : ALAN B. GOLDSAMT

It is certified that error appears in the above-identified patent and that said Letters Patent are hereby corrected as shown below:

Claim 1, line 7, delete "0", insert -- "0" --
Claim 1, line 7, delete "9", insert -- "9" --
Claim 1, line 19, delete "1", insert -- "1" --
Claim 1, line 19, delete "12", insert -- "12" --

Signed and Sealed this

Seventh Day of December 1976

[SEAL]

Attest:

RUTH C. MASON
*Attesting Officer*

C. MARSHALL DANN
*Commissioner of Patents and Trademarks*